(12) United States Patent  
Kitao

(10) Patent No.: US 9,685,517 B2  
(45) Date of Patent: Jun. 20, 2017

(54) SEMICONDUCTOR DEVICE, AND METHOD FOR PRODUCING THE SAME

(71) Applicant: RENESAS ELECTRONICS CORPORATION, Kanagawa (JP)

(72) Inventor: Ryohei Kitao, Kanagawa (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 81 days.

(21) Appl. No.: 14/732,295

(22) Filed: Jun. 5, 2015

(65) Prior Publication Data

US 2015/0357424 A1    Dec. 10, 2015

(30) Foreign Application Priority Data

Jun. 6, 2014 (JP) .................... 2014-118090

(51) Int. Cl.
| | |
|---|---|
| H01L 29/417 | (2006.01) |
| H01L 29/423 | (2006.01) |
| H01L 29/16 | (2006.01) |
| H01L 29/45 | (2006.01) |
| H01L 29/06 | (2006.01) |
| H01L 21/8234 | (2006.01) |
| H01L 27/088 | (2006.01) |

(52) U.S. Cl.
CPC ......... *H01L 29/41741* (2013.01); *H01L 21/823475* (2013.01); *H01L 29/0696* (2013.01); *H01L 29/16* (2013.01); *H01L 29/4236* (2013.01); *H01L 29/45* (2013.01); *H01L 27/088* (2013.01)

(58) Field of Classification Search
None
See application file for complete search history.

(56) References Cited

U.S. PATENT DOCUMENTS

| | | | |
|---|---|---|---|
| 7,928,505 B2 * | 4/2011 | Hirao | H01L 29/407 |
| | | | 257/330 |
| 8,187,949 B2 | 5/2012 | Kameyama | |
| 8,502,274 B1 * | 8/2013 | Matoy | H01L 23/528 |
| | | | 257/208 |
| 2005/0170555 A1 | 8/2005 | Hirano et al. | |
| 2007/0238263 A1 * | 10/2007 | Yilmaz | H01L 21/6835 |
| | | | 438/455 |

FOREIGN PATENT DOCUMENTS

| | | |
|---|---|---|
| JP | 2005-244165 A | 9/2005 |
| JP | 2010-92895 A | 4/2010 |

* cited by examiner

*Primary Examiner* — Ali Naraghi  
(74) *Attorney, Agent, or Firm* — McDermott Will & Emery LLP

(57) ABSTRACT

A silicon substrate is restrained from being warped. A substrate is formed by use of a silicon substrate. The substrate has a first surface and a second surface opposite to each other. A metal film is formed over the first surface. An interconnection layer is formed over the second surface. The metal film has a face centered cubic lattice structure. When the metal film is measured by XRD (X-ray diffraction), the [111] orientation intensity A(111), the [220] orientation intensity A(220) and the [311] orientation intensity A(311) of the metal film satisfy the following: $A(111)/\{A(220)+A(311)\} \geq 10$.

6 Claims, 14 Drawing Sheets

SEMICONDUCTOR DEVICE, AND METHOD FOR PRODUCING THE SAME

CROSS-REFERENCE TO RELATED APPLICATIONS

The disclosure of Japanese Patent Application No. 2014-118090 filed on Jun. 6, 2014 including the specification, drawings and abstract is incorporated herein by reference in its entirety.

BACKGROUND

The present invention relates to a semiconductor device, and a method for producing a semiconductor device, and is a technique applicable to, for example, a power device.

As a switching element for supplying electric power, a power device is frequently used. The power device has, for example, a structure described in Japanese Unexamined Patent Application Publication No. 2010-92895 (Patent Literature 1). In Patent Literature 1, a semiconductor substrate is used to form a vertical transistor. Specifically, the semiconductor substrate has a first surface and a second surface opposite to each other. The transistor has a source in the first surface, and has a drain in the second surface.

Furthermore, according to Patent Literature 1, the source is made of a first electrode formed on the first surface, and the drain is made of a second electrode formed on the second surface. The first and second electrodes are made of a metal, or metals having the same thermal expansion coefficient. Patent Literature 1 states that according to this structure, the semiconductor substrate is prevented from being warped even when heat is applied to the semiconductor substrate.

JP-A No. 2005-244165 (Patent Literature 2) describes the following semiconductor chip: a semiconductor chip having a first surface and a second surface opposite to each other, in which a first electrode is formed on the first face, and a second electrode is formed on the second surface.

According to Patent Literature 2, the semiconductor chip is produced as follows: A first electrode is initially formed on a first surface of a semiconductor wafer. Next, a supporting substrate which is to face the semiconductor wafer is located over the first surface of the semiconductor wafer to interpose the first electrode between the substrate and the wafer. Next, a second electrode is formed on a second surface of the semiconductor wafer. Next, the supporting substrate is taken away from the semiconductor wafer. Next, the semiconductor wafer is diced. In this way, the above-mentioned semiconductor chip is obtained. Patent Literature 2 states that even when the first and second electrodes are located over the first and second surfaces, respectively, the semiconductor wafer can be restrained from being warped by effect of the supporting substrate.

As a substrate in which transistors are formed, a silicon substrate is frequently used. However, the silicon substrate may be warped by, for example, an interconnection layer (insulating layer) formed on a surface of the silicon substrate. This warp may cause the silicon substrate to be cracked. The inventors have made investigations for restraining a silicon substrate from being warped. Other objects and novel features of the present invention will be made evident from the description of the present specification, and attached drawing.

SUMMARY

According to an aspect of the present invention, a substrate formed by use of a silicon substrate has a first surface and a second surface opposite to each other. A metal film is formed over the first surface. An interconnection layer is formed over the second surface of the substrate. The metal film has a face centered cubic lattice structure. When the metal film MF is measured by XRD (X-ray diffraction), the [111] orientation intensity A(111), the [220] orientation intensity A(220) and the [311] orientation intensity A(311) of the metal film MF satisfy the following: $A(111)/\{A(220)+A(311)\} \geq 10$.

According to an embodiment of the aspect, the metal film is formed by electroplating.

According to the aspect, the silicon substrate is restrained from being warped.

DETAILED DESCRIPTION

With reference to the drawings, embodiments of the present invention will be described. In all the drawings, the same or similar reference signs or numbers are attached to constituent elements equivalent to each other, respectively. An overlapped description thereabout is appropriately omitted.

First Embodiment

Figure 1:
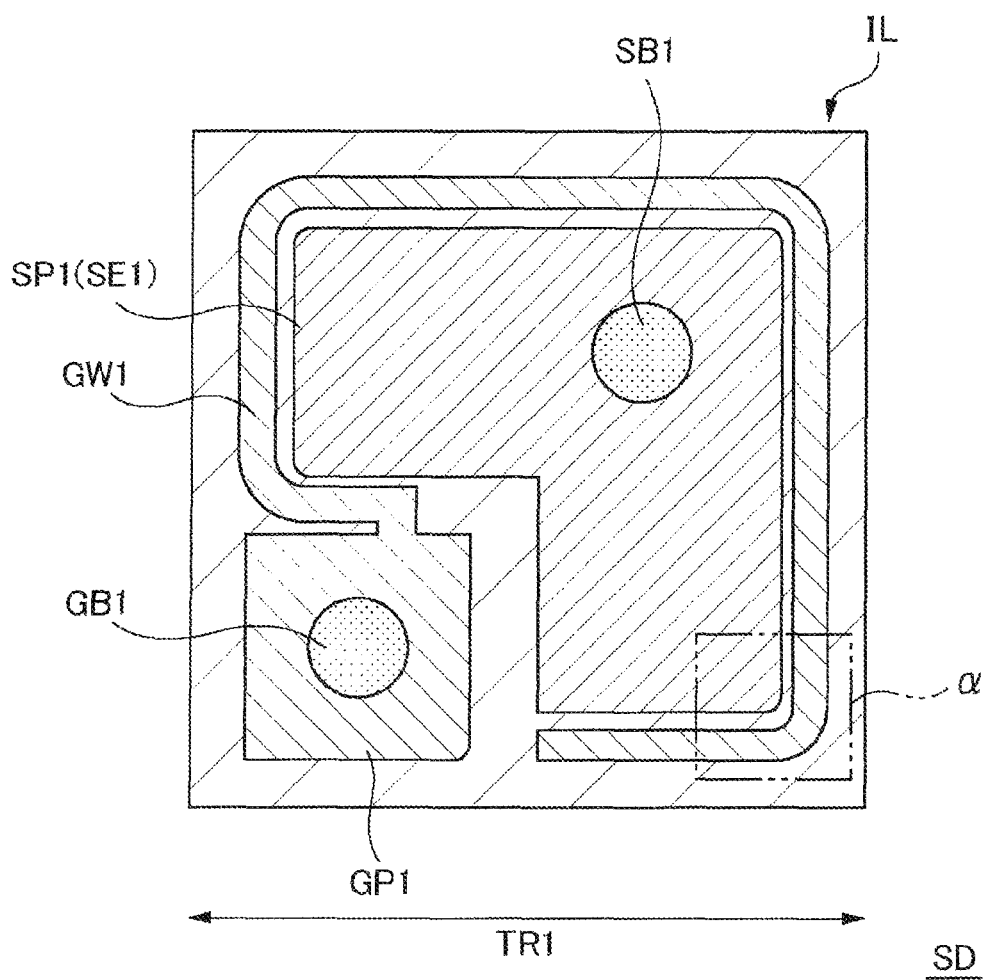
FIG. 1 is a plan view illustrating a structure of a semiconductor device according to a first embodiment of the present invention.
Figure 2:
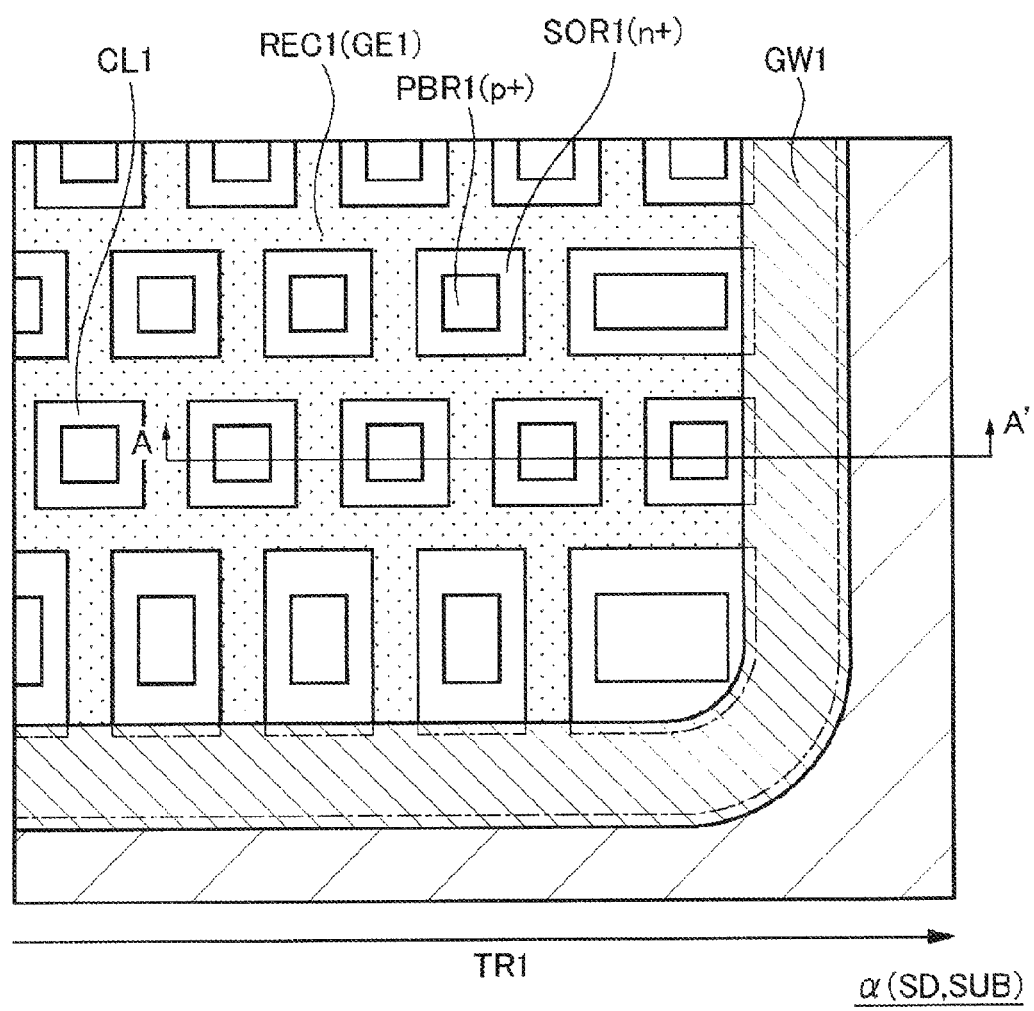
FIG. 2 is an enlarged view of a region surrounded by an alternate long and two short dashes line α in FIG. 1.
Figure 3:
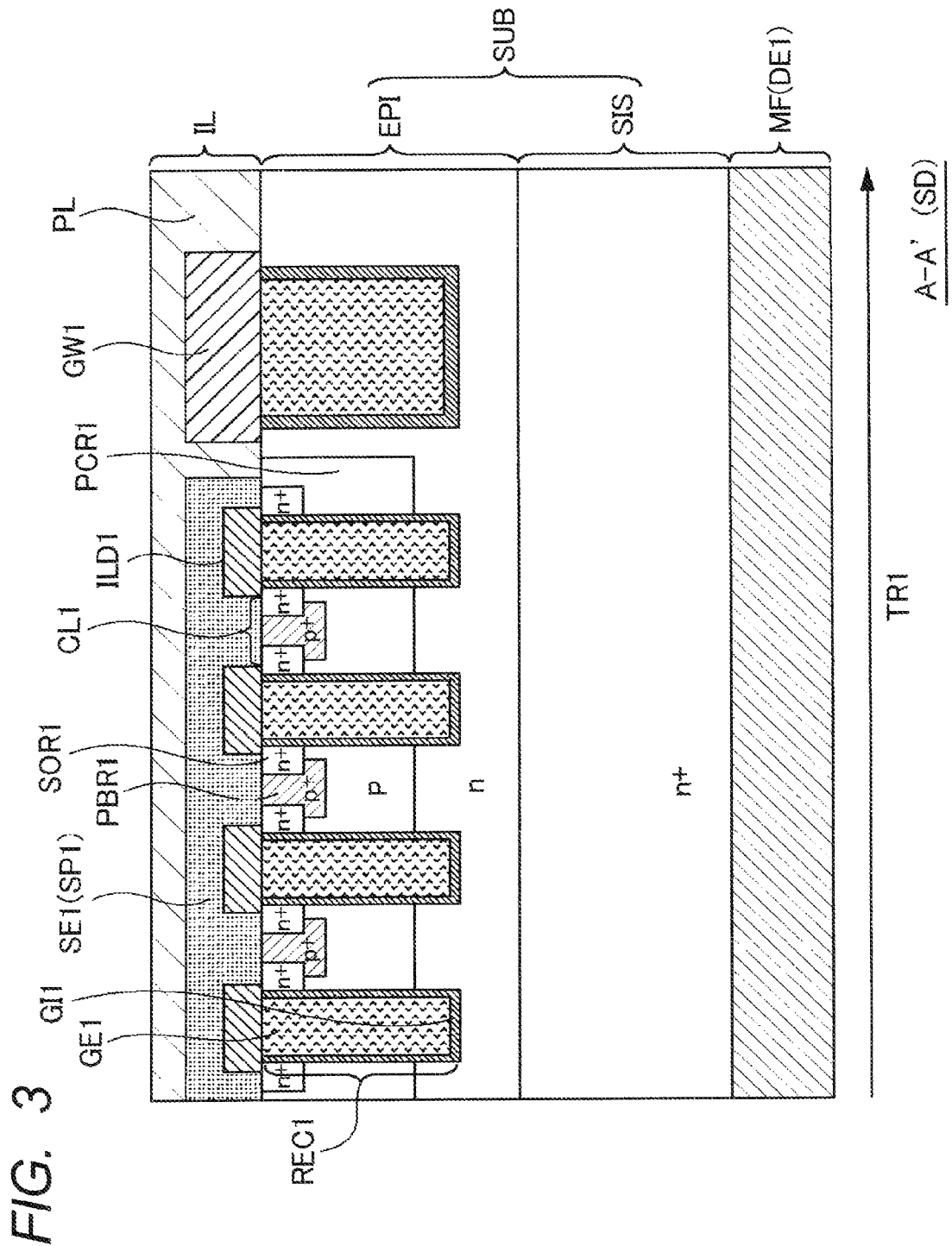
FIG. 3 is a sectional view taken on line A-A' of FIG. 2.

FIG. 1 is a plan view illustrating a structure of a semiconductor device SD according to a first embodiment of the present invention. FIG. 2 is an enlarged view of a region surrounded by an alternate long and two short dashes line α in FIG. 1. FIG. 3 is a sectional view taken on line A-A' of FIG. 2. As illustrated in FIG. 3, the semiconductor device SD has a substrate SUB, a metal film MF, and an interconnection layer IL. A silicon substrate SIS is used to form the substrate SUB. The substrate SUB has first and second surfaces opposite to each other. The metal film MF is formed on the first surface. The interconnection layer IL is formed on the second surface. The metal film MF has a face centered cubic lattice structure. Furthermore, when the metal film MF is measured by XRD (X-ray diffraction), the [111] orientation intensity A(111), the [220] orientation intensity A(220) and the [311] orientation intensity A(311) of the metal film MF satisfy the following: $A(111)/\{A(220)+A(311)\} \geq 10$. The metal film MF has a thickness of, for example, 10 μm or more. Furthermore, the metal film MF includes, for example, copper or silver. Hereinafter, the semiconductor device SD will be described in detail.

As illustrated in FIG. 1, the semiconductor device SD has a gate pad GP1 and a source pad SP1 in the interconnection layer IL. A gate bump GB1 is located on the gate pad GP1. Similarly, a source bump SB1 is located on the source pad SP1. The gate pad GP1 and the source pad SP1 are each formed to include, for example, an alloy of aluminum and copper (AlCu). The gate bump GB1 and the source bump SB1 are each, for example, a solder ball.

In the embodiment illustrated in FIG. 1, the planar shape of the source pad SP1 is such a shape that a depression is made into a rectangular shape by cutting a corner of the rectangular shape. The planar shape of the gate pad GP1 is a rectangular shape. The gate pad GP1 is positioned in the depression. Furthermore, a gate interconnection GW1 is extended from the gate pad GP1. The gate interconnection GW1 surrounds the source pad SP1 clockwise when the substrate SUB (see FIG. 3) is viewed from the interconnection layer IL side of the substrate SUB. However, the planar shape of each of the source pad SP1, the gate pad GP1 and the gate interconnection GW1 is not limited to the example illustrated in FIG. 1.

As illustrated in FIG. 2, a recess REC1 (the shape of a cross section of the recess REC1 will be described later with reference to FIG. 3) is made in the second surface of the substrate SUB. As will be described later also, a gate electrode GE1 is embedded in the recess REC1. The gate electrode GE1 is coupled to the gate electrode GE1 at a region where the gate electrode GE1 overlaps with the gate interconnection GW1 when the gate electrode GE1 is viewed in plan. When viewed in plan, plural cells CL1 are partitioned from each other on the second surface of the substrate SUB through the recess REC1. In the embodiment illustrated in FIG. 2, these cells CL1 are arranged in a lattice form when viewed in plan. The planar shape of each of the cells CL1 is a rectangular shape. However, the arrangement and the respective planar shapes of the cells CL1 are not limited to the examples of those illustrated in FIG. 2.

As illustrated in FIG. 3, in the present embodiment, the substrate SUB is used to form a vertical transistor TR1 (first transistor). Specifically, the substrate SUB has the silicon substrate SIS, an epitaxial layer EPI of a first-conductive type (first-conductive type semiconductor layer), and a channel region PCR1 of a second-conductive type (first second-conductive type region). The transistor TR1 has the recess REC1 (first recess), the gate electrode GE1 (first gate electrode), source regions SOR1 (first first-conductive type regions), a source electrode SE1 (first source electrode), and a drain electrode DE1 (first drain electrode).

The first- and second-conductive types may each be one of a p-type and an n-type as far as the first- and second-conductive types are conductive types reverse to each other. Hereinafter, a description will be made on the supposition that the first-conductive type is an n-type and the second-conductive type is a p-type.

The silicon substrate SIS is an $n^+$ silicon substrate (first-conductive type semiconductor substrate). The film thickness of the silicon substrate SIS is, for example, from 30 to 200 μm both inclusive. As will be detailed later, the silicon substrate SIS may be warped. When the film thickness of the silicon substrate SIS is, in particular, small, the silicon substrate SIS is easily warped. Against this inconvenience, in the present embodiment, such a warp is relieved by effect of the metal film MF.

The epitaxial layer EPI (for example, a silicon epitaxial layer) is formed on the front surface of the silicon substrate SIS (at a side of the substrate SIS that is opposite to the metal film MF side thereof). In the embodiment illustrated in FIG. 3, the epitaxial layer EPI is a first-conductive type semiconductor layer (n-type semiconductor layer). In a front surface layer of the epitaxial layer EPI, the second-conductive type channel region PCR1 is formed. The epitaxial layer EPI may have a lattice constant different from that of the silicon substrate SIS. In this case, the silicon substrate SIS is warped. Even in such a case, the present embodiment makes it possible to relieve the warp of the silicon substrate SIS by effect of the metal film MF, as will be detailed later.

In the second-conductive type channel region PCR1, the recess REC1 is made. The recess REC1 penetrates the second-conductive type channel region PCR1. The lower end of the recess REC1 is positioned in the epitaxial layer EPI. In the recess REC1, a gate insulating film GI1 is formed on/along the bottom and inner side surfaces of the recess REC1. The gate insulating film GI1 is, for example, a silicon oxide film ($SiO_2$). Furthermore, the gate electrode GE1 is embedded in the recess REC1. The gate electrode GE1 is formed to include, for example, a polysilicon. Additionally, an interlayer dielectric ILD1 is formed over the opening in the recess REC1. In this manner, the gate electrode GE1 is covered with the interlayer dielectric ILD1.

As has been shown in FIG. 2, the gate electrode GE1 is electrically coupled to the gate interconnection GW1. As has been shown in FIG. 1, the gate interconnection GW1 is electrically coupled to the gate pad GP1 and the gate bump GB1. This manner makes it possible to use the gate bump GB1 to apply a gate voltage for the transistor R1.

The source regions SOR1 are $n^+$ regions (first-conductive type regions), and are formed in the second-conductive type channel region PCR1. The source regions SOR1 are adjacent to the recess REC1 when viewed in plan. The source regions SOR1 are formed to be shallowly formed than the second-conductive type channel region PCR1 is formed.

Furthermore, in the second-conductive type channel region PCR1, second-conductive type body regions PBR1 are formed. The second-conductive type body regions PBR1 are $p^+$ regions, and have a higher impurity concentration than the second-conductive type channel region PCR1. In the embodiment illustrated in FIGS. 2 and 3, the second-conductive type body regions PBR1 are formed in the front surface layer of the individual cells CL1 and at portions where the source regions SOR1 are not formed. The second-conductive type body regions PBR1 are formed deeply than the source regions SOR1.

The source electrode SE1 is formed on the front surface of the epitaxial layer EP1. The source electrode SE1 covers the source regions SOR1, the second-conductive type body regions PBR1 and the interlayer dielectric IlD1. In this way, the source electrode SE1 is electrically coupled to the source regions SOR1 and the second-conductive type body regions PBR1. As described above, the gate electrode GE1 is covered with the interlayer dielectric ILD1. Thus, the gate electrode GE1 and the source electrode SE1 are electrically coupled to each other through the interlayer dielectric ILD1.

As has been in FIG. 1, the source electrode SE1 is the source pad SP1. The source pad SP1 is electrically coupled to the source bump SB1. Accordingly, a source voltage for the transistor TR1 can be applied, using the source bump SB1.

A protective film PL is formed on the source pad SP1. In this way, the source pad SP1 is protected from effects of the external environment (for example, oxidization) by the protective film PL. The protective film PL is, for example, a polyimide film. The protective film PL further covers the gate pad GP1 and the gate interconnection GW1 (see FIG. 1). Openings are made in portions of the protective film PL. The gate bump GB1 and the source bump SB1 are positioned in the openings, respectively. As described herein, in the embodiment illustrated in FIGS. 1 to 3, the interconnection layer IL is formed to include the source electrode SE1 (source pad SP1), the gate pad GP1, the gate interconnection GW1, and the protective film PL. The thickness of the interconnection layer IL (in the embodiment in FIG. 3, the total of the thickness of the source electrode SE1 and that of the protective film PL) is, for example, from 6 to 12 μm both inclusive.

The silicon substrate SIS may be warped by effect of the interconnection layer IL. Even in such a case, the present embodiment makes it possible to relieve the warp of the silicon substrate SIS by effect of the metal film MF, as will be described later also.

The drain electrode DE1 is formed on the rear surface of the silicon substrate SIS (at a side of the silicon substrate SIS that is opposite to the interconnection layer IL side thereof). The drain electrode DE1 is the metal film MF. A warp of the silicon substrate SIS can be relieved by effect of the metal film MF, details of which will be described later. In other words, the metal film MF fulfils not only a function of relieving the warp of the silicon substrate SIS, but also a function as the drain electrode DEI.

Figure 4:
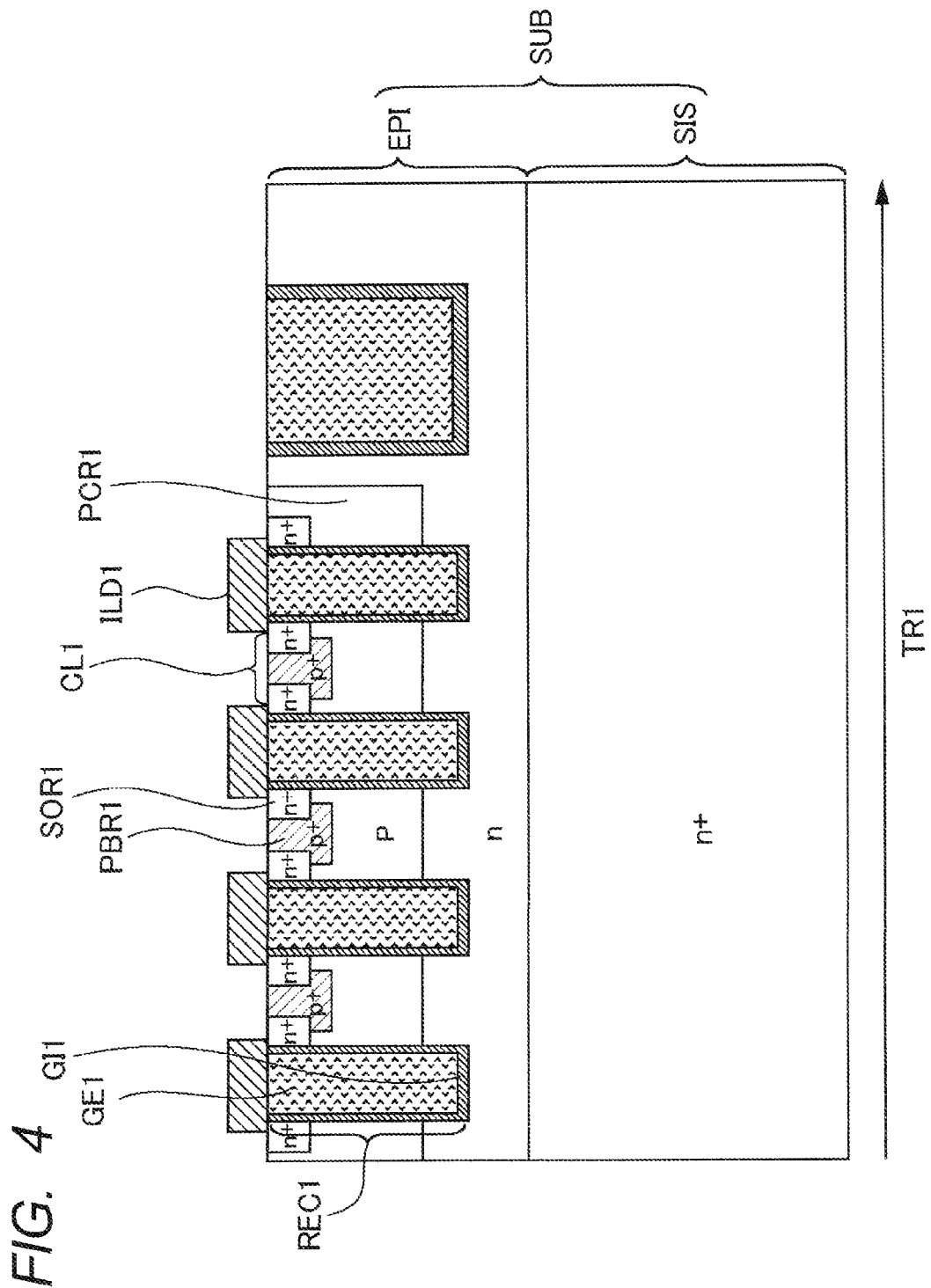
FIG. 4 is a sectional view illustrating a step of a method for producing the semiconductor device illustrated in FIGS. 1 to 3.

FIGS. 4 to 7 are sectional views illustrating a method for producing the semiconductor device SD illustrated in FIGS. 1 to 3. As illustrated in FIG. 4, a substrate SUB is initially used to form a transistor TR1.

Detailedly, an epitaxial layer EP1 is initially formed on a surface of a silicon substrate SIS by epitaxial growth. Next, a second-conductive type channel region PCR1 is formed in a front layer of the epitaxial layer EPI by ion implantation.

Next, a recess REC1 is made in the front surface of the epitaxial layer EPI by etching. Next, a gate insulating film GI1 is formed on/along the bottom surface and inner side surfaces of the recess REC1. Next, a polysilicon film (conductive film which is to be a gate electrode GE1 in a subsequent step) is formed onto the epitaxial layer EPI. In this way, the polysilicon film is embedded into the recess REC1. In this case, the polysilicon film is formed to extend over any adjacent ones out of portions of the recess REC1. Next, the front surface layer of the polysilicon film is etched-back to remove the polysilicon film extended over the adjacent portions of the recess REC1. In this way, the gate electrode GE1 referred to above is formed in the recess REC1.

Next, source regions SOR1 and second-conductive type body regions PBR1 are formed in a front surface layer of the second-conductive type channel region PCR1 by ion implantation. Next, an insulating film (insulating film which is to be an interlayer dielectric ILD1 in the next step) is formed on the epitaxial layer EPI. Next, this insulating film is patterned to form the interlayer dielectric ILD1 referred to just above.

Figure 5:
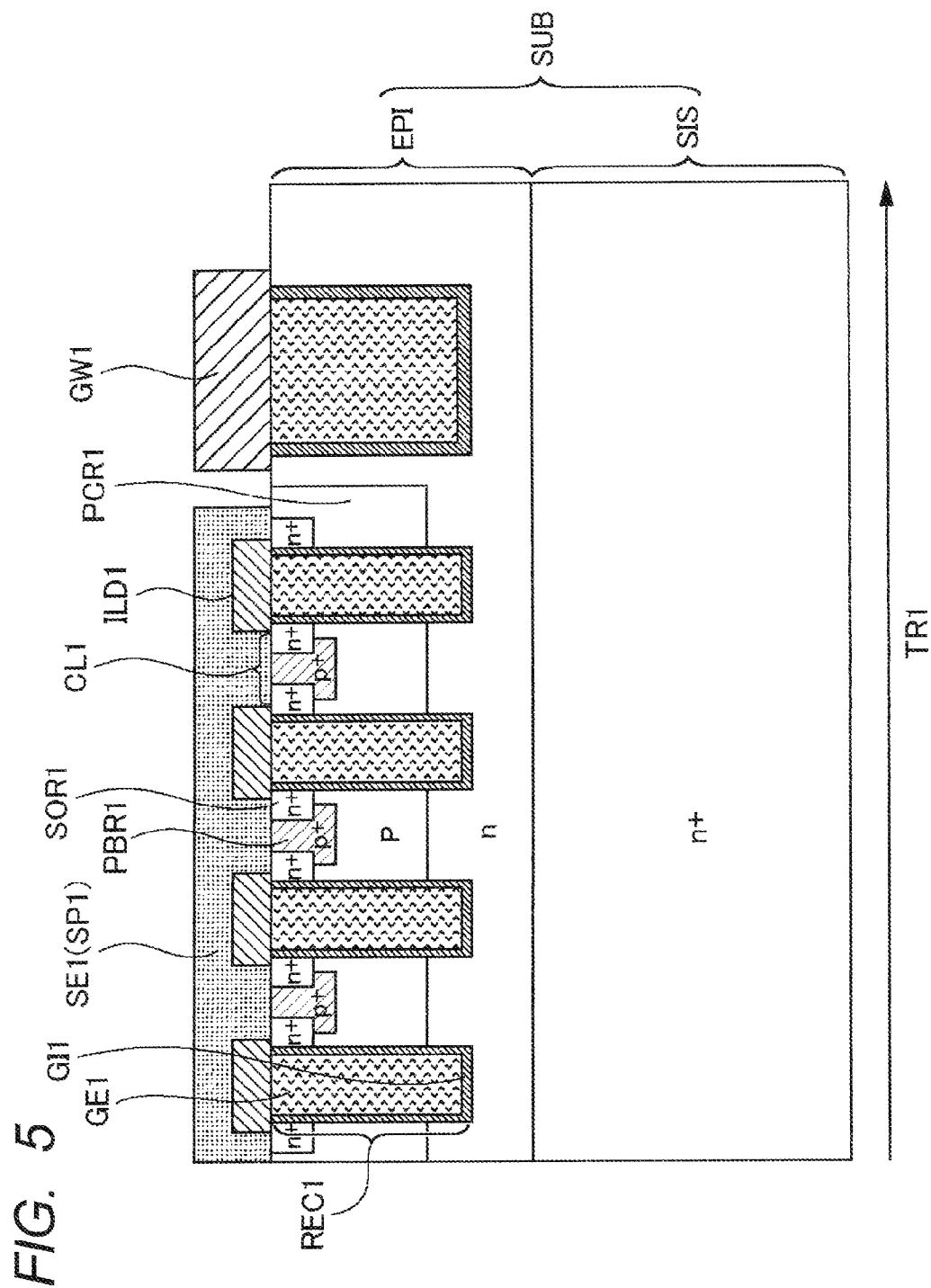
FIG. 5 is a sectional view illustrating a subsequent step of the producing method.

Next, as illustrated in FIG. 5, a source pad SP1 (source SE1), a gate pad GP1 and a gate interconnection GW1 (see FIG. 1) are formed on the epitaxial layer EP1. Detailedly, a metal film (for example, a film of an alloy of aluminum and copper (AlCu)) is formed on the epitaxial layer EP1 by sputtering. Next, this metal film is patterned to form a source pad SP1, a gate pad GP1 and a gate interconnection GW1. Next, a protective film PL is formed on these pads and the interconnection.

Figure 6:
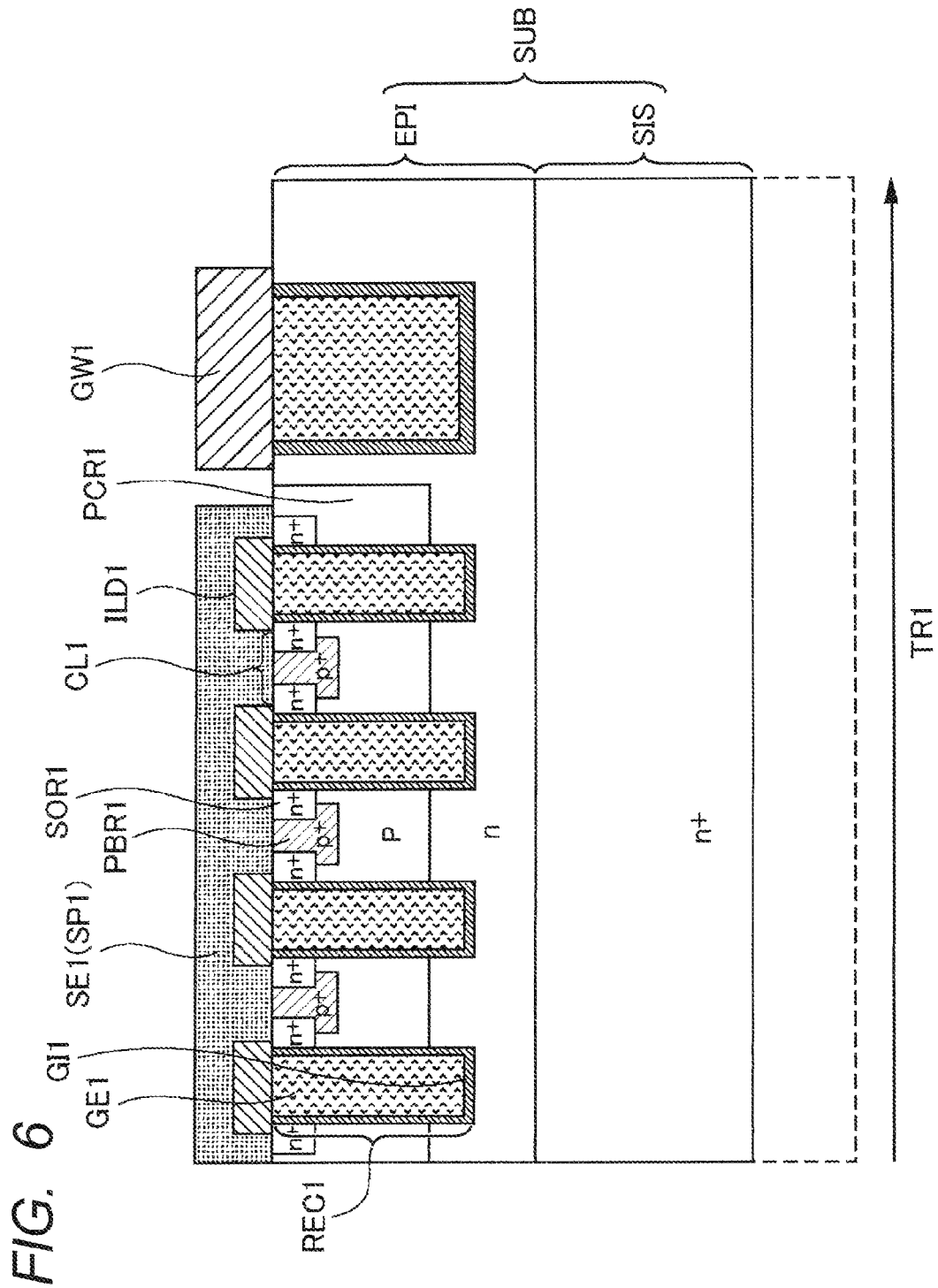
FIG. 6 is a sectional view illustrating a subsequent step of the producing method.

Next, as illustrated in FIG. 6, the rear surface of the silicon substrate SIS (at a side of the silicon substrate SIS that is opposite to the epitaxial layer EP1 side thereof) by, for example, wet etching, dry etching or CMP (chemical mechanical polishing). In the embodiment illustrated in FIG. 6, by the processing of the rear surface, the film thickness of the silicon substrate SIS is set into the range of, for example, 30 to 200 μm both inclusive.

Next, a barrier metal layer (not illustrated) and a seed layer (not illustrated) are formed in this order onto the rear surface of the silicon substrate SIS. The barrier metal film is, for example, a titanium (Ti) film. The barrier metal film is a metal film for preventing atoms in the seed layer, and a metal film MF (which will be described later also and will be formed on the seed layer in a subsequent step) from diffusing into the silicon substrate SIS. The material of the seed layer is varied in accordance with the material of the metal film MF. When the metal film MF is a copper (Cu) film, the seed layer is a copper (Cu) or gold (Au) film. When the metal film MF is a silver (Ag) film, the seed layer is a silver (Ag) or gold (Au) film. The formation of the barrier metal layer and that of the seed layer may be continuously attained in the same apparatus. In other words, after the barrier metal layer is formed, the seed layer may be formed without being taken out from an apparatus in which the barrier metal layer has been formed.

Figure 7:
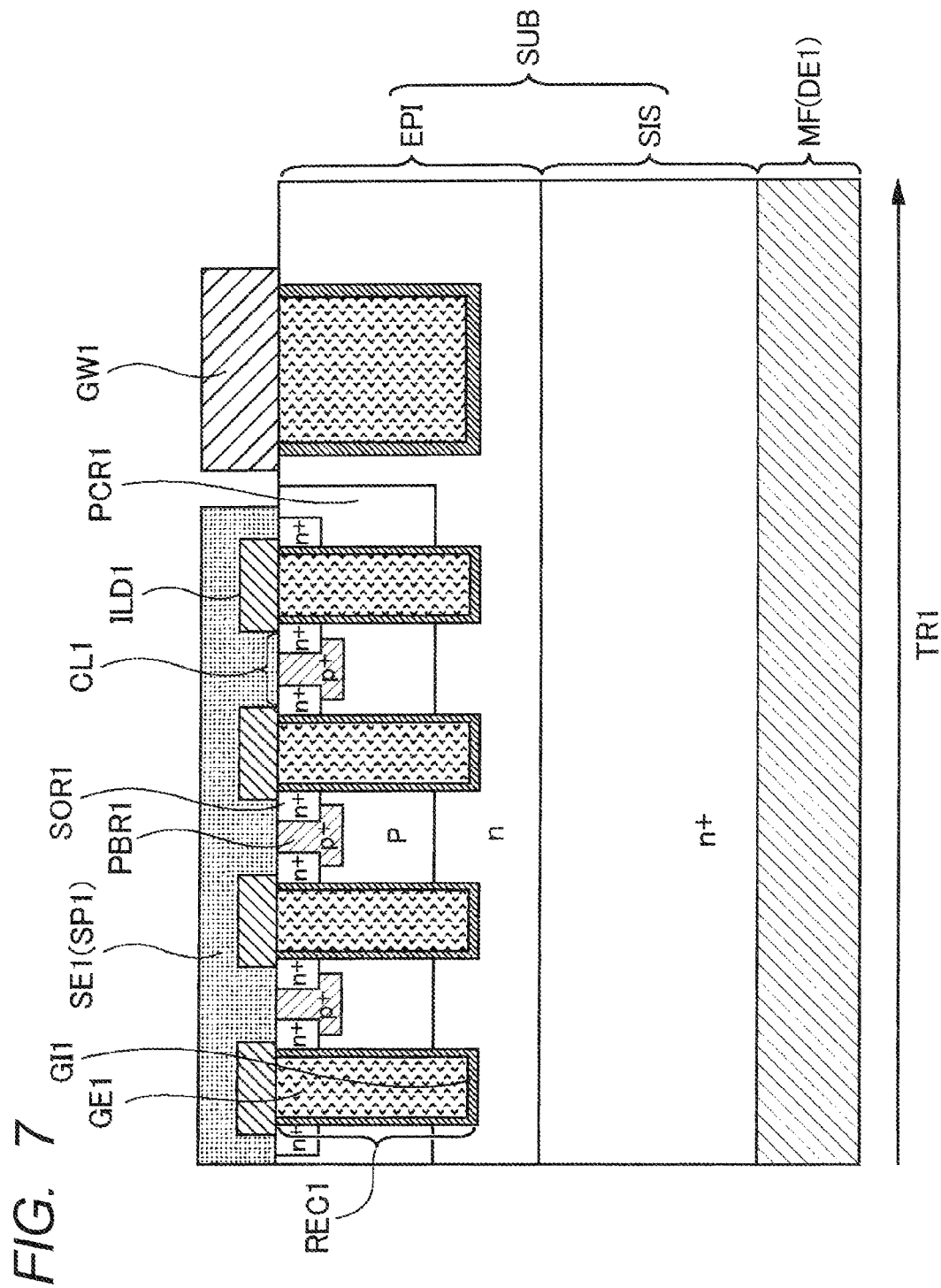
FIG. 7 is a sectional view illustrating a subsequent step of the producing method.

Next, as illustrated in FIG. 7, the metal film MF referred to just above is formed on the rear surface of the silicon substrate SIS by electroplating. As will be detailed later, the orientation of the metal film MF is controlled by controlling the density of a current caused to flow into a plating solution in the electroplating. The metal film MF is, for example, a copper (Cu) or silver (Ag) film. In the embodiment illustrated in FIG. 7, the metal film MF is formed into a thickness of, for example, 10 μm or more by the electroplating. When the metal film MF is a copper (Cu) film, a plating solution used therefor is, for example, a copper sulfate plating solution. In this case, it is allowable to immerse the substrate SUB into a dilute sulfuric acid solution, and then subject the substrate SUB to electroplating.

As will be described later also, the silicon substrate SIS is restrained from being warped by effect of the metal film MF. As the metal film MF is thicker, the silicon substrate SIS is more effectively restrained from being warped. As described above, in the present embodiment, the film thickness of the metal film MF is, for example, 10 μm or more. In this case, the silicon substrate SIS is effectively restrained from being warped.

In the present embodiment, the metal film MF has been formed by the electroplating. The deposition rate of the metal film is generally larger according to electroplating than according to sputtering. For this reason, in the present embodiment, the metal film MF can be effectively formed even when the metal film MF has a film thickness as large as 10 μm or more as described above.

Next, for example, a nickel (Ni) film (not illustrated) is formed on the front surface of the metal film MF by electroplating. Next, openings are made from the front surface of the protective film PL into this film. Next, a gate bump GB1 and a source bump SB1 (see FIG. 1) are formed into the openings, respectively. In this way, the semiconductor device SD illustrated in FIGS. 1 to 3 is produced.

Figure 8:
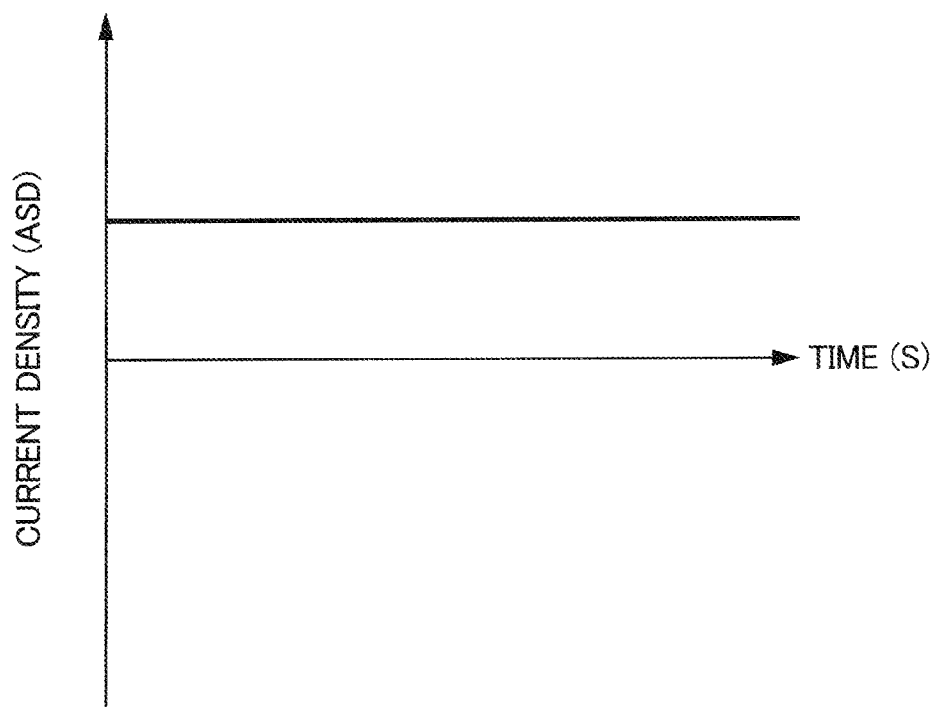
FIG. 8 is a chart showing an example of a method for controlling current density in electroplating for forming a metal film.

FIG. 8 is a chart illustrating an example of a method for controlling the current density in the electroplating for forming the metal film MF. In the example illustrated in FIG. 8, DC (direct current) plating is performed. In this example, the current density is constant. However, it is unnecessary that the current density is constant at any time. For example, when the plating is started, the current density may be smaller than that shown in FIG. 8. Moreover, when the plating is ended, the current density may be smaller than that shown in this figure.

Figure 9:
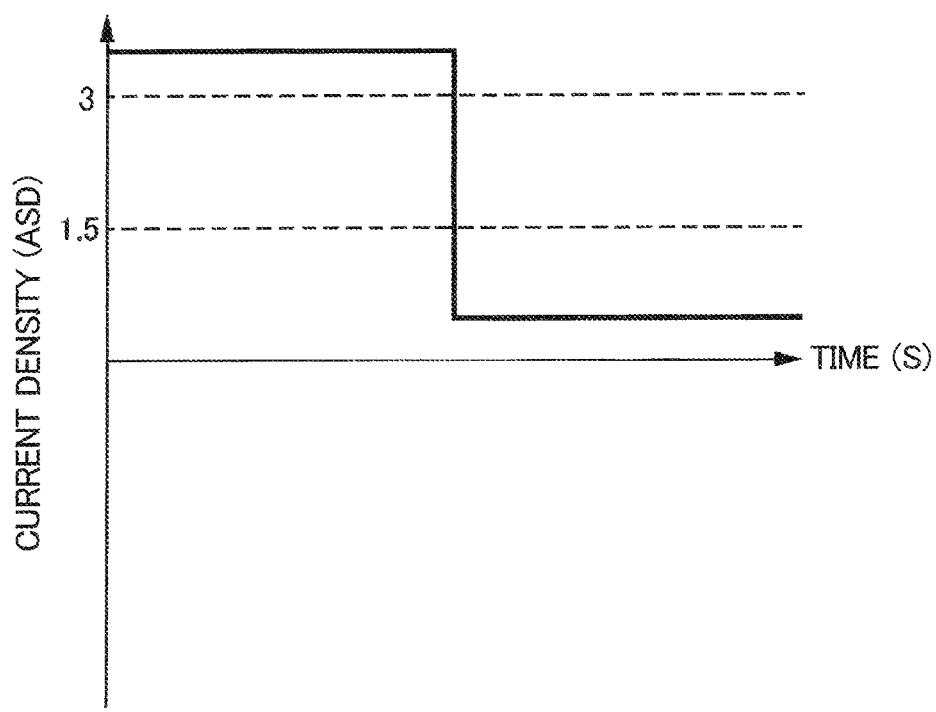
FIG. 9 is a chart showing a modified example of the example in FIG. 8.

FIG. 9 is a chart showing a modified example of the example in FIG. 8. In the example shown in FIG. 9, a step (large current step) is performed in which DC plating is performed at a current density higher than 1.5 ASD (A/dm$^2$), and subsequently another step (small current step) is performed in which DC plating is performed at a current density of 1.5 ASD (A/dm$^2$) or less. As will be detailed later, a metal film MF formed by DC plating at a small current density has an intense orientation in the [111] direction. However, when the current density is small, the deposition rate of the metal film MF is low. Thus, the current density (to be used) may be controlled as shown in FIG. 9. In this way, the deposition rate is made high in the large current step, and the metal film is made good in orientation in the small current step. In other words, even when the metal film MF is made poor in orientation in the large current step, the orientation can be made good.

In order to heighten the deposition rate of the metal film MF, the current density can be set to, for example, 3 ASD or more as shown in FIG. 9 in the large current step. However, the step of performing DC plating at a current density of 3 ASD or more is not limited to the large current step shown in FIG. 9. For example, in a large current step, DC plating is performed at a current density more than 1.5 ASD and less than 3 ASD, and further DC plating may be performed at a current density of 3 ASD or more after a small current step is performed.

Any large current step and any small current step (in the present invention) may be continuous as shown in FIG. 9, or may be discontinuous. When the large current step and the small current step are discontinuous, between the large current step and the small current step, for example, DC plating may be performed at a current density larger than that in the small current step but smaller than that in the large current step. In a different example, between the large current step and the small current step, a step may be set up in which the current density in the large current step is gradually lowered to the current density in the small current step.

Figure 10:
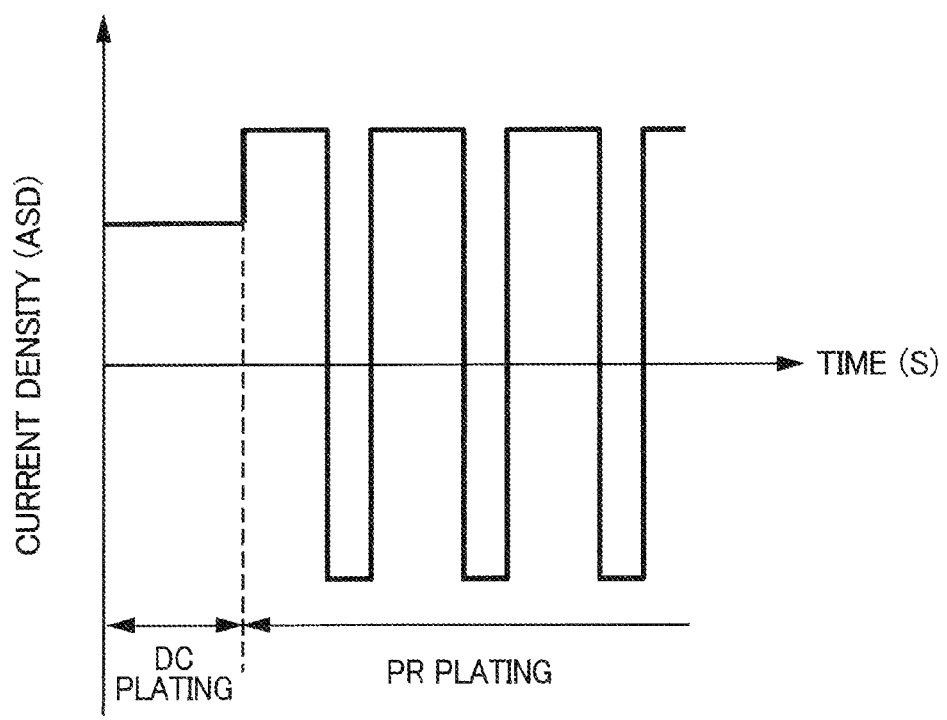
FIG. 10 is a chart showing another modified example of the example in FIG. 8.

FIG. 10 is a chart showing another modified example of the example in FIG. 8. In the example shown in FIG. 10, DC plating is initially performed. Thereafter, PR (pulse-reverse) plating is performed. As will be detailed later, a (partial) metal film MF formed by the PR plating has a more intense orientation in the [111] direction than a (partial) metal film MF formed by the DC plating. However, the deposition rate of the (partial) metal film MF is lower according to the PR plating than according to the DC plating. Thus, the current density may be controlled as shown in FIG. 10. This manner makes the deposition rate high in the DC plating and makes the orientation good in the PR plating.

The (partial) metal film MF formed by the PR plating becomes far higher in [111] orientation than the (partial) metal film MF formed by the DC plating. Accordingly, even when the film thickness of the (partial) metal film MF formed by the DC plating is larger than that of the (partial) metal film MF formed by the PR plating, the [111] orientation of the metal film MF is satisfactorily exhibited.

In the example shown in FIG. 10, the PR plating has been performed after the DC plating. However, the DC plating and the PR plating may be reverse to each other in order. The DC plating and the PR plating are performed as has been shown in FIG. 10, and subsequently DC plating may be again performed.

Figure 11:
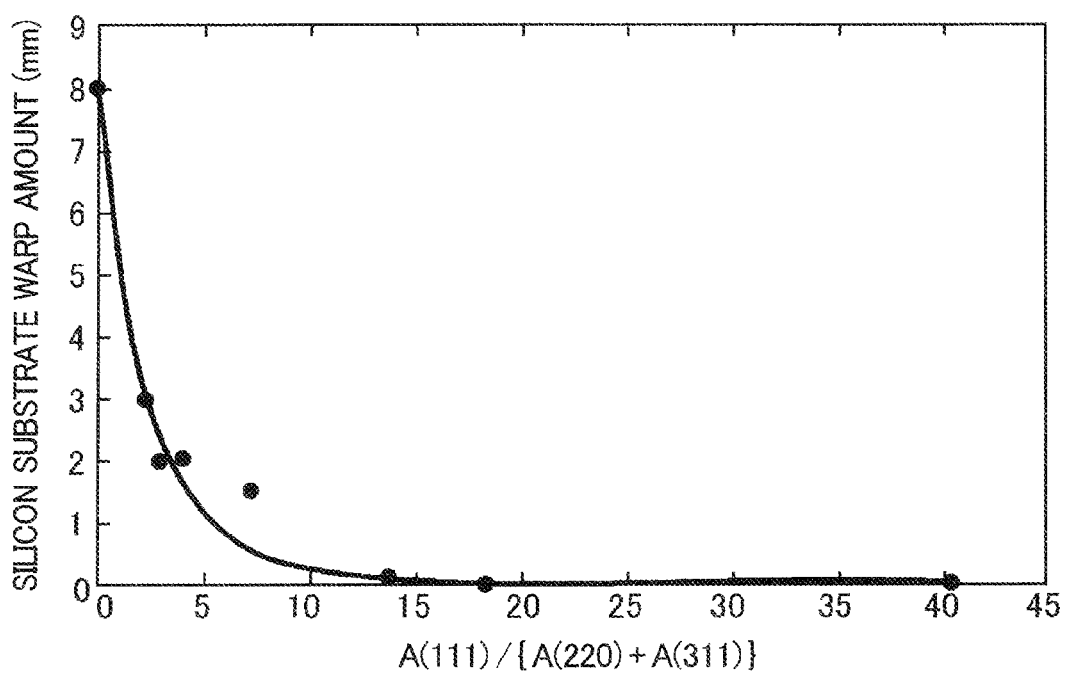
FIG. 11 is a graph showing a relationship between the warp amount of a silicon substrate, and a value of $A(111)/\{A(220)+A(311)\}$ of a metal film.

FIG. 11 is a graph showing a relationship between the warp amount of a silicon substrate SIS as described above and the value of A(111)/{A(220)+A(311)} of a metal film MF as described above. As described above, the orientation intensities A(111), A(220) and A(311) denote the orientation intensity in the [111] direction of the metal film MF, that in the [220] direction thereof, and that in the [311] direction thereof, respectively. Individual plotted points shown in FIG. 11 represent results in the case of forming the metal film MF by electroplating. In this figure, the orientation intensities A(111), A(220) and A(311) have been measured by XRD. A curve shown in the figure is a curve to which the individual plotted points have been fitted.

As shown in FIG. 11, the warp amount of the silicon substrate SIS has a tendency of becoming smaller as the value of A(111)/{A(220)+A(311)} becomes large. In the case of, in particular, A(111)/{A(220)+A(311)}≥10, the warp amount of the silicon substrate SIS can be adjusted to a value less than 1 mm.

Furthermore, the plotted points of the value of A(111)/{A(220)+A(311)}≥10 are results obtained in the case of performing DC plating at a low current density, or PR plating as has been shown in FIGS. 9 and 10. According to the results, it can be concluded that the metal film MF can have an intense orientation in the [111] direction by performing DC plating at a low current density, or PR plating.

According to the present embodiment, the silicon substrate SIS is used to form the substrate SUB. The metal film MF is formed on the rear surface of the silicon substrate SIS by electroplating. In this case, the metal film MF comes to have an orientation intensity in the [111] direction. In this case, the warp amount of the silicon substrate SIS is controllable. Furthermore, as the value of A(111)/{A (220)+A (311)} is larger, the warp amount of the silicon substrate SIS can be made smaller. In the case of, particularly, A(111)/{A (220)+A(311)}≥10, the warp amount of the silicon substrate SIS can be set to a value less than 1 mm.

Second Embodiment

Figure 12:
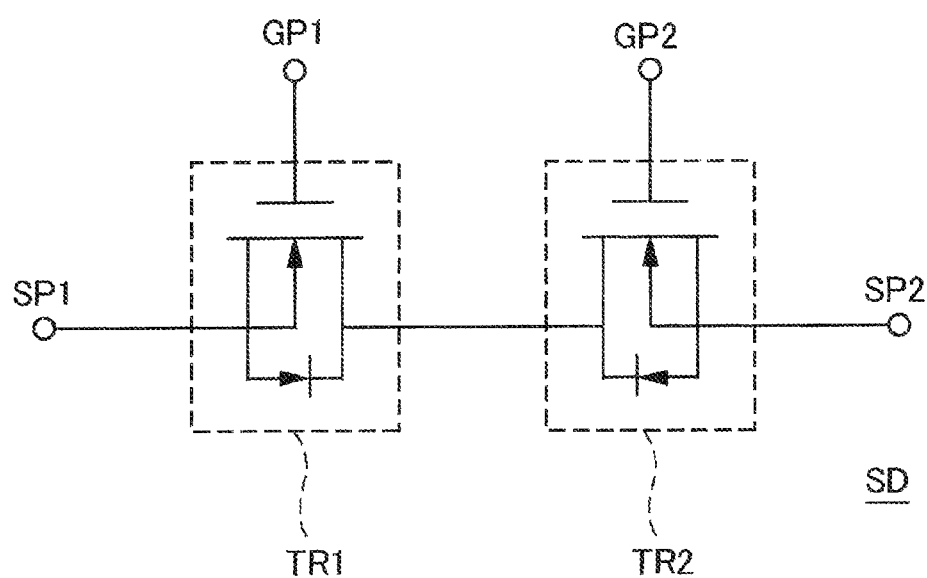
FIG. 12 is a circuit chart illustrating a structure of a semiconductor device according to a second embodiment of the present invention.
Figure 13:
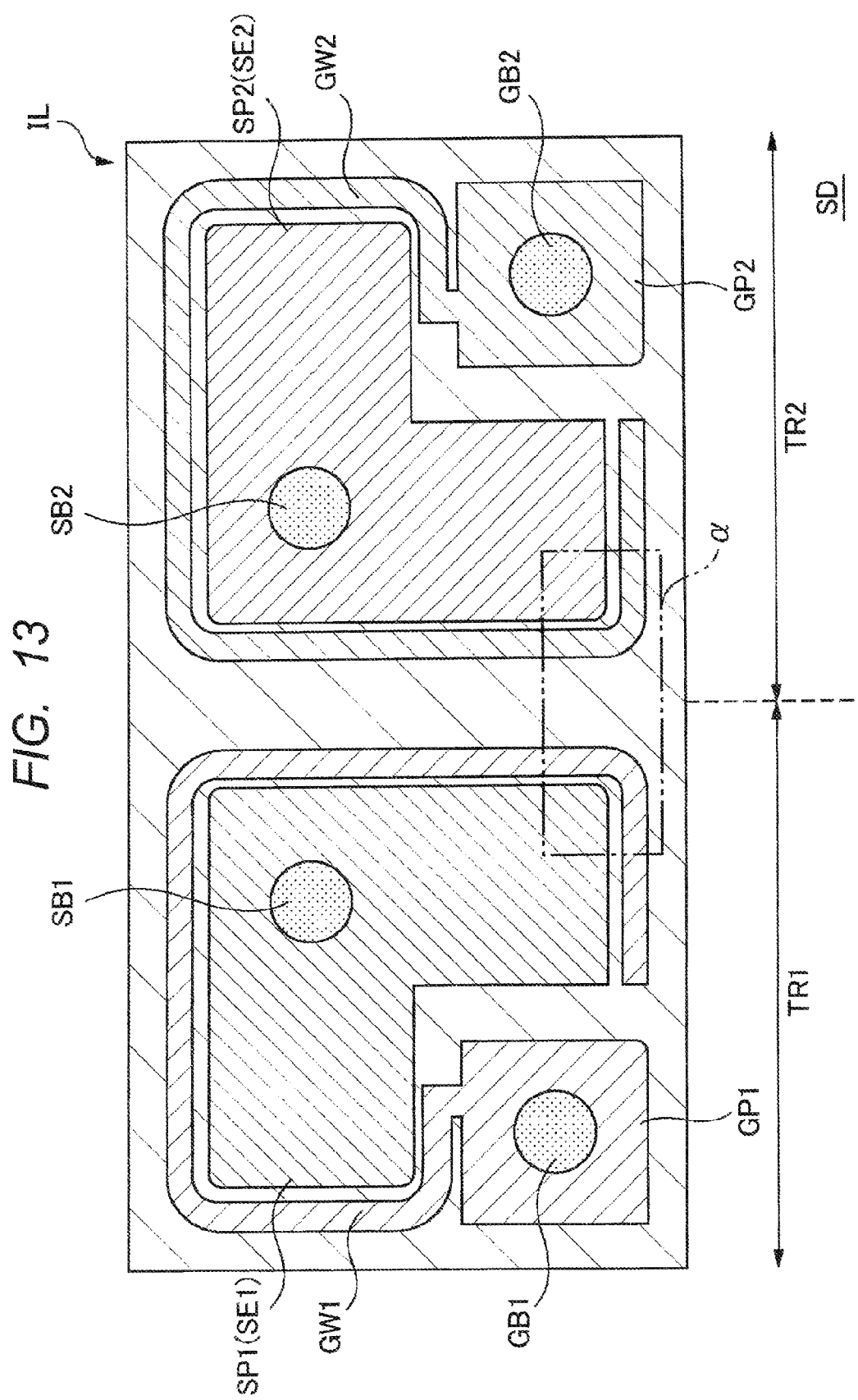
FIG. 13 is a plan view illustrating the structure of the semiconductor device according to the second embodiment.
Figure 14:
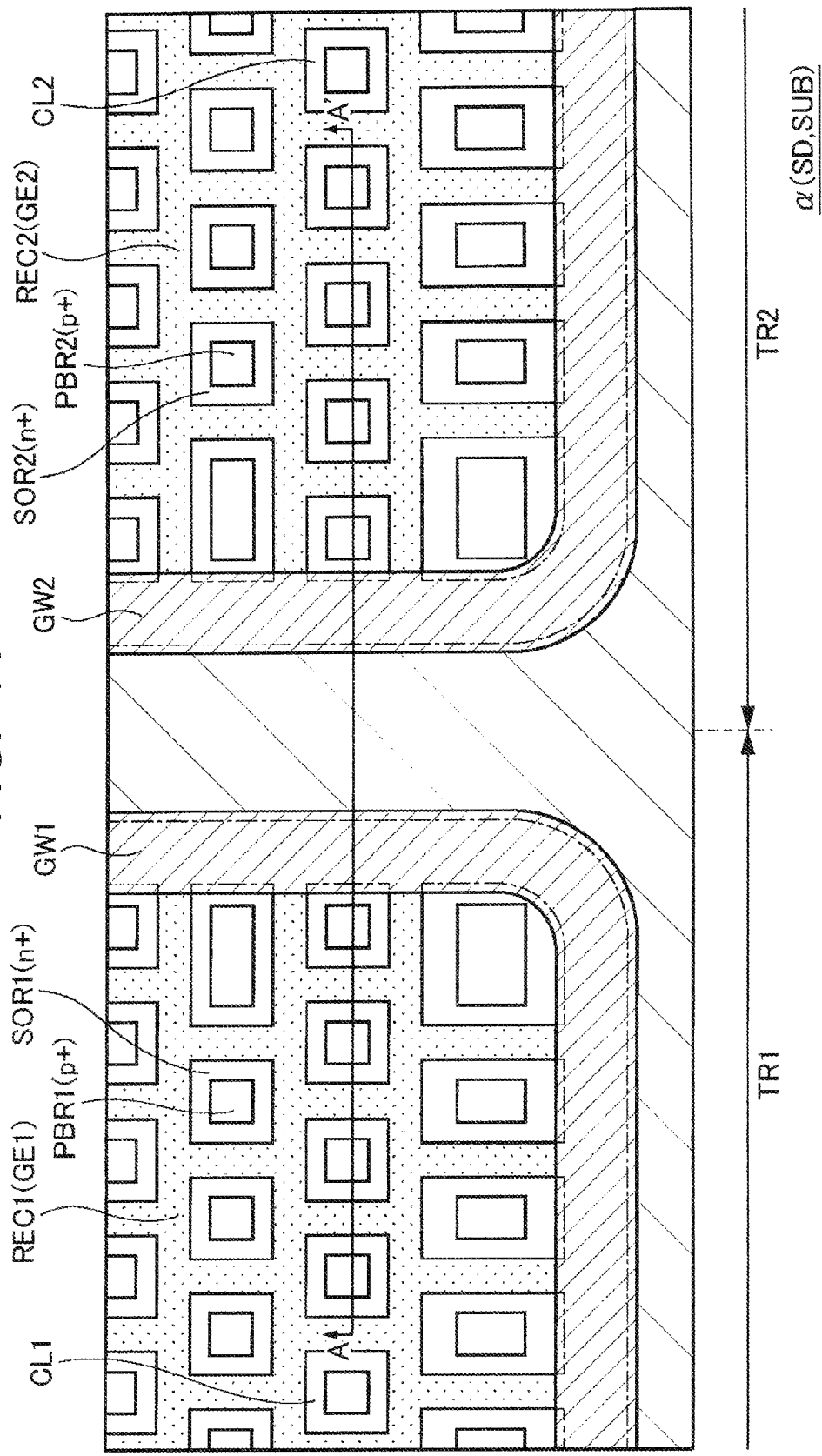
FIG. 14 is an enlarged view of a region surrounded by an alternate long and two short dashes line α in FIG. 13.
Figure 15:
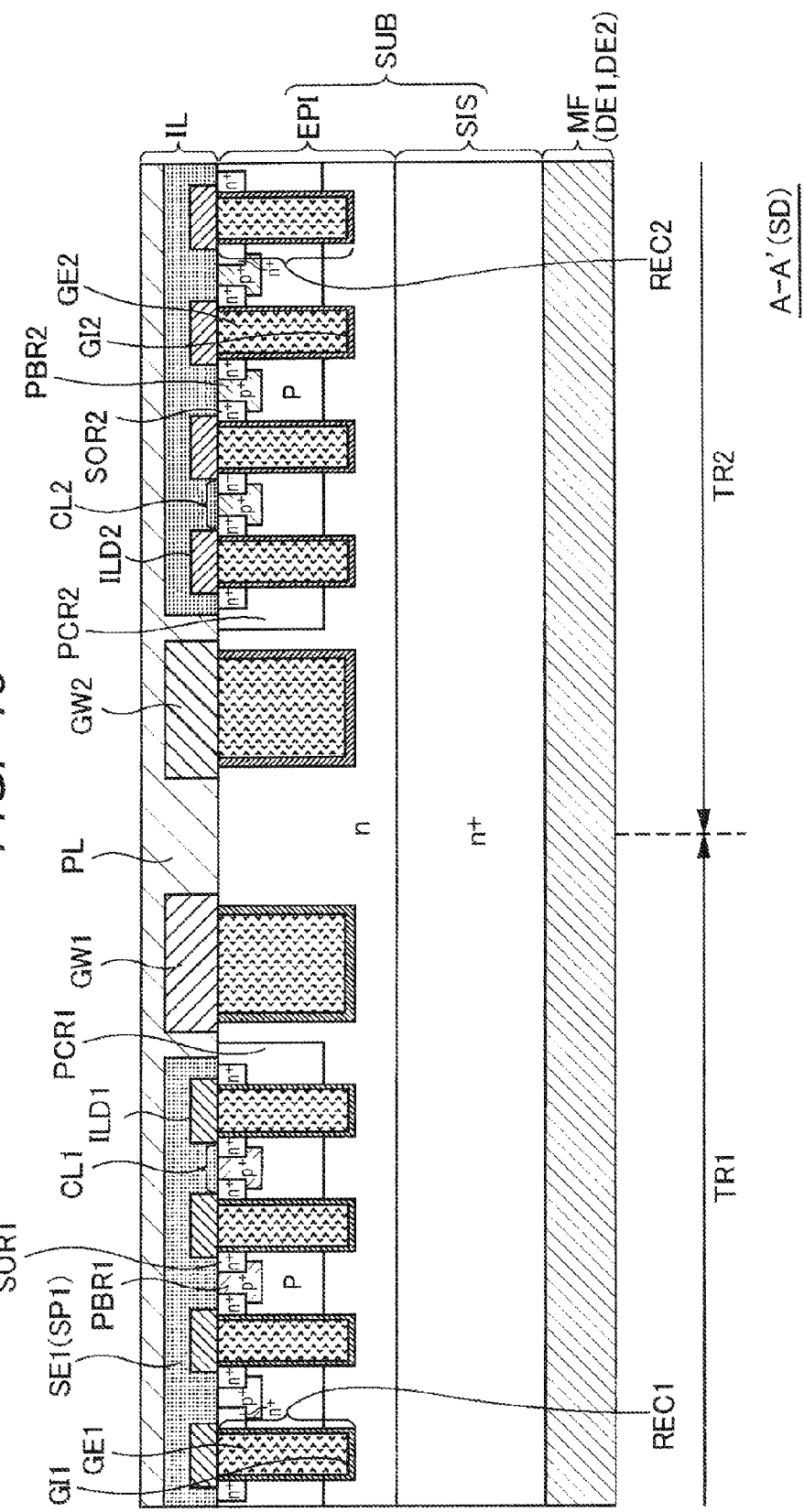
FIG. 15 is a sectional view taken on line A-A' of FIG. 14.

FIG. 12 is a circuit chart illustrating a structure of a semiconductor device SD according to a second embodiment of the present invention. FIG. 13 is a plan view illustrating the structure of the semiconductor device SD according to the second embodiment, and corresponds to FIG. 1 about the first embodiment. FIG. 14 is an enlarged view of a region surrounded by an alternate long and two short dashes line α in FIG. 13, and corresponds to FIG. 2 about the first embodiment. FIG. 15 is a sectional view taken on line A-A' of FIG. 14, and corresponds to FIG. 3 about the first embodiment. The semiconductor device SD according to the present embodiment has the same structure as the semiconductor device SD according to the first embodiment except the following below.

As illustrated in FIG. 12, the semiconductor device SD includes transistors TR1 and TR2. In the transistors TR1 and TR2, their drains are coupled in series to each other. Gates of the transistors TR1 and TR2 are coupled in series to gate pads GP1 and GP2, respectively. Furthermore, sources of the transistors TR1 and TR2 are coupled in series to source pads SP1 and SP2, respectively. Furthermore, as illustrated in FIG. 12, in each of the transistors TR1 and TR2, a parasitic diode is formed. The parasitic diode of the transistor TR1 is turned into a forward direction from the transistor TR1 toward the transistor TR2. The parasitic diode of the transistor TR2 is turned into a forward direction from the transistor TR2 toward the transistor TR1.

The semiconductor device SD is usable as, for example, a protective circuit when a battery (for example, a lithium battery) is electrically charged or discharged. In this case, the gate pad GP1 of the transistor TR1 and the gate pad GP2 of the transistor 2 are electrically coupled to a control IC (integrated circuit). Through this control IC, the transistors TR1 and TR2 are controlled to be switched on or off.

In the case of using the semiconductor device SD as the protective circuit, a current when the battery is electrically charged flows, for example, from the transistor TR1 to the transistor TR2. Even when the control IC detects an abnormal current in this case to switch off the transistor TR1, the current unfavorably flows through the parasitic diode of the transistor TR1 to the transistor TR2. However, even in such a case, the abnormal current can be prevented from flowing into the battery when the transistor TR2 is switched off through the control IC. Also in a case where a current flows from the transistor TR2 to the transistor TR1 when the battery is electrically discharged, the semiconductor device can be operated in the same way.

As illustrated in FIG. 13, in the same manner as in the first embodiment, the transistor TR1 has, in its interconnection layer IL, the gate pad GP1, a gate interconnection GW1, and the source pad SP1. Furthermore, in the same manner as in the first embodiment, the transistor TR1 has a gate bump GB1 on the gate pad GP1, and further has a source bump SB1 on the source pad SP1. In the same manner as in the transistor TR1, the transistor TR1 has the gate pad GP2, a gate interconnection GW2, the source pad SP2, a gate bump GB2, and a source bump SB2.

In the embodiment illustrated in FIG. 13, individual constituent elements of the transistor TR1 are positioned linear-symmetrically with ones of the transistor TR2 about a symmetric axis passing between the transistors TR1 and TR2 when the transistors are viewed in plan. In more detail, in the same manner as in the first embodiment (in FIG. 1), the planar shape of the source pad SP1 of the transistor TR1 is such a shape that a depression is made into a rectangular shape by cutting a corner of the rectangular shape. The gate pad GP1 is positioned in this depression.

Furthermore, in this case, the planar shape of the source pad SP1 is a hexagonal shape having, in the depression, a first apex having an interior angle larger than 180 degrees. The gate pads GP1 and GP2 are positioned linear-symmetrically with each other to make the gate pads GP1 and GP2 opposite to each other across a portion of the source pad SP1 and a portion of the source pad SP2 in a direction perpendicular to the above-mentioned symmetric axis.

The structure of the semiconductor device SD is more specifically as follows: The gate interconnection GW1 is extended from the gate pad GP1. The gate interconnection GW1 surrounds the source pad SP1 clockwise when viewed from the interconnection layer IL side of a substrate SUB (see FIG. 15). In this case, in the hexagonal shape of the source pad SP1, from the first apex, the second, third, fourth, fifth and sixth apexes are clockwise arranged in this order. About a straight line parallel with a line through which the fourth and fifth apexes are linked with each other, the individual constituent elements of the transistor TR1 are arranged symmetrically with those of the transistor TR2.

As illustrated in FIG. 14, in the same manner as in the first embodiment, in the transistor TR1, a recess REC1 is made in the front surface of the substrate SUB. When viewed in plan, plural cells CL1 are partitioned from each other on the front surface substrate SUB through the recess REC1. In the same way, in the transistor TR2, a recess REC2 is made in the front surface of the substrate SUB. In the same manner as in the transistor 1, plural cells CL2 are partitioned from each other on the front surface substrate SUB through the recess REC2 when viewed in plan.

As illustrated in FIG. 15, the transistor TR1 has the same constituent elements (such as a gate electrode GE1 and source regions SOR1) as in the first embodiment. The transistor TR2 has the same constituent elements as in the transistor TR1. Specifically, the substrate SUB is used to form the transistor TR2 in the same way as in the transistor TR1. The substrate SUB has a silicon substrate SIS, an epitaxial layer EP1, and a second-conductive type channel region PCR2 (second second-conductive type region). The transistor TR2 has the recess REC2 (second recess), a gate electrode GE2 (second gate electrode), an interlayer dielectric ILD2, source regions SOR2 (second first-conductive type regions), second-conductive type body regions PBR2, a source electrode SE2 (second source electrode), a drain electrode DE2 (second drain electrode), and a protective film PL.

The constituent elements of the transistors TR1 are partially common to those of the TR2. For example, in the embodiment illustrated in FIG. 15, the transistors TR1 and TR2 are formed by use of the silicon substrate SIS common for these transistors, and the epitaxial layer EP1 common therefor. Furthermore, in the embodiment in this figure, the source pad SP1 and the gate interconnection GW1 of the transistor TR1, and the source pad SP2 and the gate interconnection GW2 of the transistor TR2 are covered with the protective film PL common therefor.

Furthermore, in the embodiment illustrated in FIG. 15, the drain electrode DE1 of the transistor TR1 and the drain electrode DE2 of the transistor TR2 are the same metal film MF. In this way, a large proportion of a current flowing between the transistors TR1 and TR2 flows through the metal film MF. In other words, the metal film MF fulfils not only a function as the drain of each of the transistors TR1 and TR2, but also a function of lowering a resistance against the current flowing between the transistors TR1 and TR2.

Figure 16:
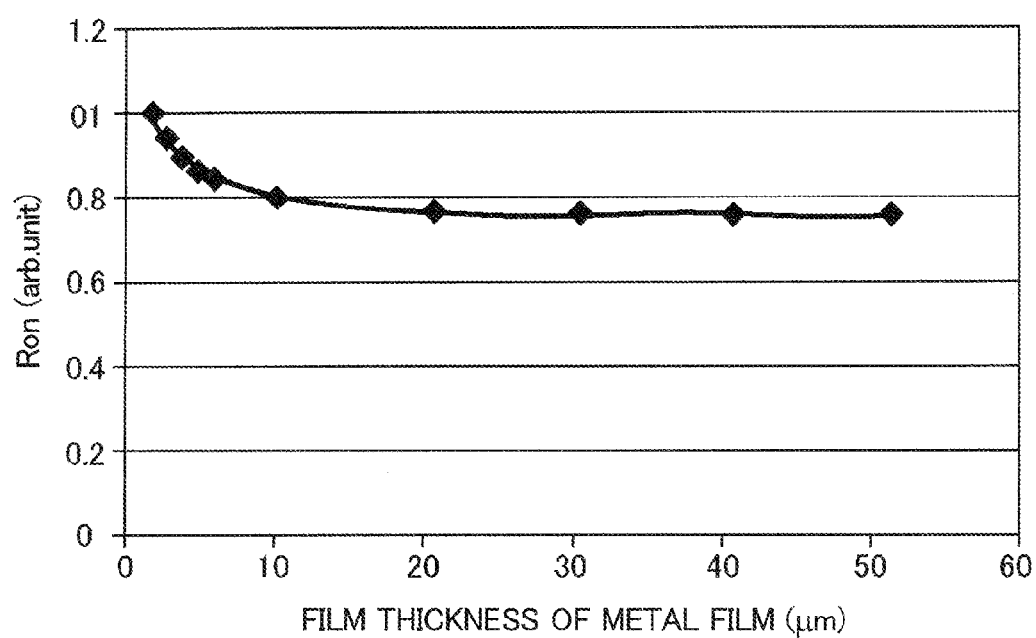
FIG. 16 is a graph showing a relationship between the film thickness of a metal film and the on-resistance between transistors.

FIG. 16 is a graph showing a relationship between the film thickness of the metal film MF, and the on-resistance Ron between the transistors TR1 and TR2. As illustrated in FIG. 16, the on-resistance Ron lowers as the film thickness of the metal film MF is increased. When the film thickness of the metal film MF is, particularly, 10 μm or more, the effect of lowering the on-resistance Ron is heightened. The metal film MF according to FIG. 16 is formed to include copper (Cu).

As described above, in the present embodiment, the metal film MF is formed on the rear surface of the silicon substrate SIS (at a side of the substrate SIS that is opposite to the interconnection layer IL side thereof). In the same manner as in the first embodiment, this manner makes it possible to relieve a warp of the silicon substrate SIS. Furthermore, in the embodiment, the silicon substrate SIS is used to form the transistors TR1 and TR2. The transistors TR1 and TR2 are formed, using the same metal film MF1. For this reason, the on-resistance against the current flowing between the transistors TR1 and TR2 can be decreased.

Modified Example

Figure 17:
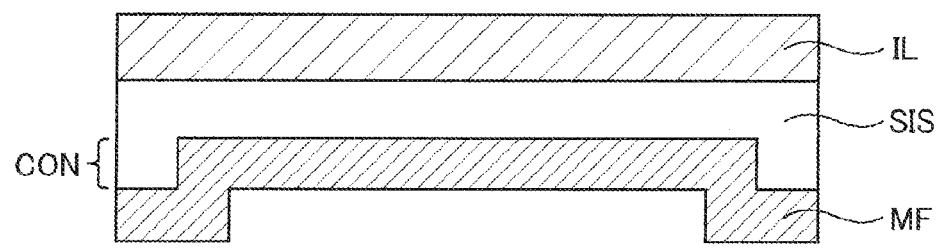
FIG. 17 is a sectional view illustrating the structure of the semiconductor device according the modified example.

FIG. 17 is a sectional view of a structure of a semiconductor device SD according to a modified example of any one of the embodiments. As illustrated in FIG. 17, a convex CON may be formed at an edge of the rear surface of a silicon substrate SIS (at a side of the substrate SIS that is opposite to the interconnection layer IL side thereof). For the convenience of description, details of constituent elements (such as an epitaxial layer EP1, a gate electrode GE1 and a source electrode SE1) constituting a transistor TR1 are not illustrated in FIG. 17.

The planar shape of the silicon substrate (wafer) SIS is, for example, circular. In this case, the convex CON is formed along the circumference of the edge of the silicon substrate SIS when viewed in plan. This structure is obtained by making a concave in the rear surface of the silicon substrate SIS by, for example, wet etching, dry etching or CMP. In this case, the film thickness of the silicon substrate SIS of a region where the concave is made may be made, for example, smaller than 30 μm. Even when the film thickness of the silicon substrate SIS is small in this way, the convex CON makes it possible to relieve a warp of the silicon substrate SIS.

According to the modified example, the silicon substrate SIS can be prevented from being cracked between the step of polishing the rear surface of the silicon substrate SIS (illustrated in, for example, FIG. 6), and the step of forming a metal film MF in the rear surface of the silicon substrate SIS (illustrated in, for example, FIG. 7). By the formation of the metal film MF in this way, the silicon substrate SIS can be prevented from being warped. However, when the thickness of the silicon substrate SIS is small, the SIS may be unfavorably warped before the formation of the metal film MF. In this case, the silicon substrate SIS may be cracked by the warp. Against this inconvenience, the formation of the convex CON makes it possible to prevent the silicon substrate SIS from being cracked between the above-mentioned steps.

The above has specifically described the invention made by the inventors by way of the embodiments thereof. However, the present invention is not limited to the embodiments. The embodiments may be variously modified as far as the modified embodiments do not depart from the subject matter of the invention.

The metal film MF (in each of the embodiments) is applicable to, for example, a semiconductor device SD having, in its logic region and memory region, horizontal transistors, respectively. In this case, its silicon substrate SIS has, on a first surface thereof, the metal film MF. On a second surface of the silicon substrate SIS (i.e., a surface of the substrate SIS that is opposite to the first surface), the transistors are formed. Furthermore, an interconnection layer IL in which plural interlayer dielectrics are laminated onto each other is positioned over the transistors. In this case, the metal film MF functions as, for example, an electrode for giving an electrical potential to the silicon substrate SIS, or as a heat radiating plate for radiating heat from the silicon substrate SIS.

What is claimed is:

1. A semiconductor device, comprising: a substrate having a first surface and a second surface opposite to each other, and formed by use of a silicon substrate;
   a metal film formed over the first surface of the formed substrate; and
   an interconnection layer formed over the second surface of the formed substrate,
   wherein the metal film has a face centered cubic lattice structure, and when the metal film is measured by XRD (X-ray diffraction), the [111] orientation intensity A(111), the [220] orientation intensity A(220) and the [311] orientation intensity A(311) of the metal film MF satisfy the following: $A(111)/\{A(220)+A(311)\} \geq 10$.

2. The semiconductor device according to claim 1, wherein the metal film has a film thickness of 10 μm or more.

3. The semiconductor device according to claim 2, wherein the metal film is formed by electroplating.

4. The semiconductor device according to claim 1, wherein the metal film comprises at least one selected from the group consisting of copper and solver.

5. The semiconductor device according to claim 1, wherein the substrate formed by use of the silicon substrate comprises: a first-conductive type semiconductor layer positioned at the second surface side of the silicon substrate; and
   a first second-conductive type region formed in a surface layer of the first-conductive type semiconductor layer;
   the semiconductor device comprising a first transistor formed by use of the substrate formed by use of the silicon substrate;
   the first transistor comprising: a first recess formed in the first second-conductive type region, and having a lower end positioned in the first-conductive type semiconductor layer;
   a first gate electrode embedded into the first recess;
   a first first-conductive type region which is formed in the first second-conductive type region, and which is adjacent to the first recess when viewed in plan;
   a first source electrode formed in the interconnection layer, and coupled electrically to the first first-conductive type region; and
   a first drain electrode configured to be the metal film.

6. The semiconductor device according to claim 5, wherein the substrate formed by use of the silicon substrate comprises: a second second-conductive type region formed in the front surface layer of the first-conductive type semiconductor layer;
   the semiconductor device comprising a second transistor formed by use of the substrate formed by use of the silicon substrate;
   the second transistor comprising: a second recess formed in the second second-conductive type region, and having a lower end positioned in the first-conductive type semiconductor layer;
   a second gate electrode embedded into the second recess;
   a second first-conductive type region which is formed in the second second-conductive type region, and which is adjacent to the second recess when viewed in plan;
   a second source electrode formed in the interconnection layer, and coupled electrically to the second first-conductive type region; and
   a second drain electrode configured to be the metal film;
   the first source electrode and the second source electrode being formed in regions that are electrically insulated from each other; and the first drain electrode and the second drain electrode being configured to be the metal film, which is a single film.

* * * * *